United States Patent
Yamakoshi

(10) Patent No.: US 12,095,365 B2
(45) Date of Patent: Sep. 17, 2024

(54) SEMICONDUCTOR DEVICE AND SWITCHING POWER SUPPLY

(71) Applicant: Rohm Co., Ltd., Kyoto (JP)

(72) Inventor: Haruo Yamakoshi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 229 days.

(21) Appl. No.: 17/742,810

(22) Filed: May 12, 2022

(65) Prior Publication Data

US 2022/0393586 A1 Dec. 8, 2022

(30) Foreign Application Priority Data

May 31, 2021 (JP) .................. 2021-091305

(51) Int. Cl.
 *H02M 3/155* (2006.01)
 *H03F 3/45* (2006.01)

(52) U.S. Cl.
 CPC ........ *H02M 3/155* (2013.01); *H03F 3/45475* (2013.01)

(58) Field of Classification Search
 CPC ................. H02M 3/155; H03F 3/45475
 See application file for complete search history.

(56) References Cited

U.S. PATENT DOCUMENTS

| | | | | |
|---|---|---|---|---|
| 6,118,336 A | * | 9/2000 | Pullen | H03F 3/2171 330/10 |
| 7,453,251 B1 | * | 11/2008 | Mehas | H02M 3/156 323/299 |
| 7,573,252 B1 | * | 8/2009 | Griesert | G05F 3/262 323/901 |
| 2013/0308061 A1 | * | 11/2013 | Murakami | H02M 3/1582 348/730 |
| 2017/0110974 A1 | * | 4/2017 | Chen | H02M 1/08 |
| 2020/0125129 A1 | * | 4/2020 | Ibrahim | G05F 3/225 |

FOREIGN PATENT DOCUMENTS

| | | | |
|---|---|---|---|
| JP | 2013-162483 | | 8/2013 |
| JP | 2013255146 A | * | 12/2013 |

* cited by examiner

*Primary Examiner* — Harry R Behm
(74) *Attorney, Agent, or Firm* — Fish & Richardson P.C.

(57) ABSTRACT

A semiconductor device includes: an operational amplifier; an external terminal configured to be attached to an external capacitor; and a resistor configured to be connected between a node, to which an output terminal and an inverting input terminal of the operational amplifier are connected in common, and the external terminal.

8 Claims, 10 Drawing Sheets

SEMICONDUCTOR DEVICE AND SWITCHING POWER SUPPLY

CROSS-REFERENCE TO RELATED APPLICATION

This application is based upon and claims the benefit of priority from Japanese Patent Application No. 2021-091305, filed on May 31, 2021, the entire contents of which are incorporated herein by reference.

TECHNICAL FIELD

The present disclosure relates to a semiconductor device having an operational amplifier, and a switching power supply using the same.

BACKGROUND

Various techniques for securing a phase margin of an operational amplifier have been proposed in the related art.

However, with conventional semiconductor devices, it has been difficult to secure the phase margin of the operational amplifier when a large load capacitance is connected to the operational amplifier.

SUMMARY

Some embodiments of the present disclosure provide a semiconductor device capable of securing a phase margin of an operational amplifier, and a switching power supply using the same.

According to one embodiment of the present disclosure, there is provided a semiconductor device including: an operational amplifier; an external terminal configured to be attached to an external capacitor; and a resistor configured to be connected between a node, to which an output terminal and an inverting input terminal of the operational amplifier are connected in common, and the external terminal.

It should be noted that other features, elements, steps, advantages, and characteristics will be further clarified by the following embodiments for carrying out the present disclosure, and the accompanying drawings related thereto.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Switching Power Supply

Figure 1:
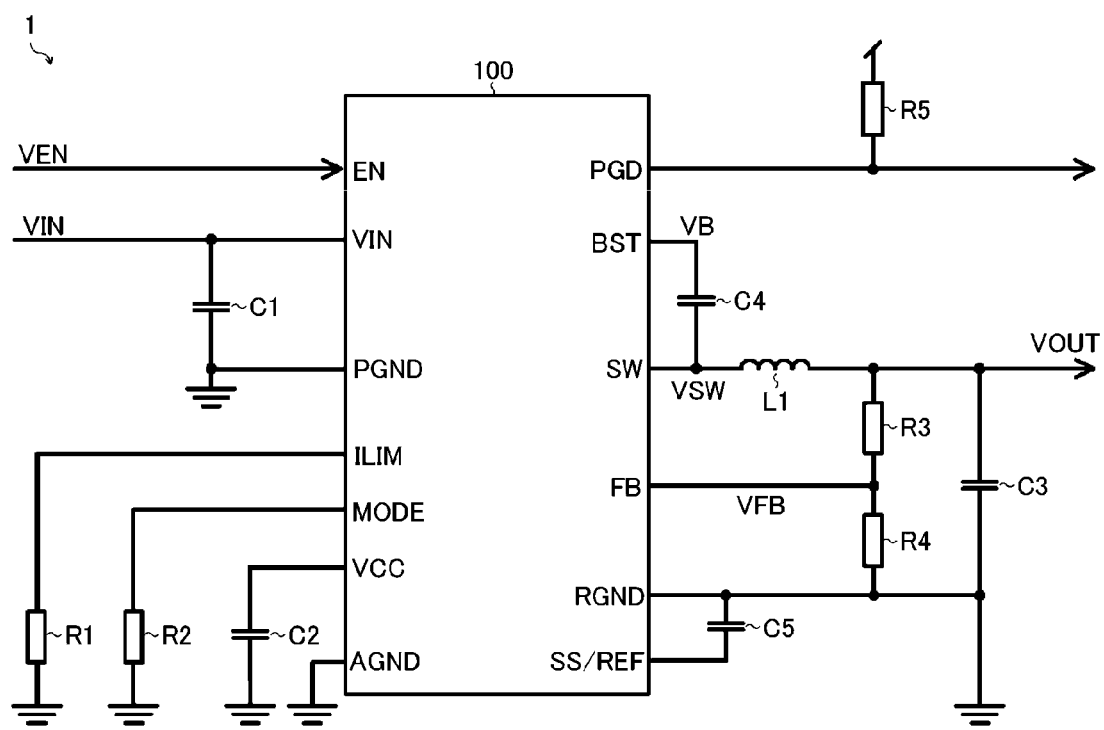
FIG. 1 is a diagram showing an overall configuration of a switching power supply.

FIG. 1 is a diagram showing an overall configuration of a switching power supply. A switching power supply 1 of this configuration example is a synchronous rectification type step-down DC/DC converter that generates a desired output voltage VOUT (for example, 0.6 to 5.5 V) from an input voltage VIN (for example, 4 to 16 V), and has a semiconductor device 100 and various discrete components (for example, capacitors C1 to C5, inductors L1, and resistors R1 to R5) externally attached to the semiconductor device 100.

The switching power supply 1 can be appropriately used as a step-down power supply for, for example, an SoC [System-on-Chip], an FPGA [Field-Programmable Gate Array], a microprocessor, or the like, or a step-down power supply for a server or a base station.

The semiconductor device 100 is a monolithic semiconductor integrated circuit device (so-called power supply control IC) that comprehensively controls the switching power supply 1. The semiconductor device 100 has a plurality of external terminals (BST, AGND, ILIM, MODE, SS/REF, RGND, FB, PGD, VIN, PGND, and VCC terminals, as shown in FIG. 1) as means for establishing electrical connection with the outside of the device.

The BST terminal is a terminal for bootstrap. The capacitor C4 (for example, 0.1 μF) for bootstrap is externally attached between the BST terminal and an SW terminal. A boot voltage VB (≅VSW+VCC) appearing at the BST terminal is a gate drive voltage of an upper transistor (not shown in FIG. 1) built in the semiconductor device 100.

The AGND terminal is a ground terminal of a control circuit (analog system circuit).

The ILIM terminal is an overcurrent detection value setting terminal. In addition, an overcurrent detection value IOCP can be arbitrarily set by using the resistor R1 externally attached between the ILIM terminal and the ground terminal (=the AGND terminal).

The MODE terminal is a switching control mode setting terminal. For example, by pulling up the MODE terminal or adjusting the resistor R2 externally attached between the MODE terminal and the ground terminal (=the AGND terminal), it is possible to arbitrarily switch combinations of switching frequencies (for example, 600 kHz, 800 kHz, and 1 MHz) and operation modes (a light load mode and a fixed PWM [Pulse Width Modulation] mode).

The SS/REF terminal is a soft start time setting terminal/ internal reference voltage setting terminal. For example, it is possible to arbitrarily adjust a soft start time tSS of an output voltage VOUT according to a capacitance value of the capacitor C5 externally attached between the SS/REF terminal and the ground terminal (=the RGND terminal). Further, since the output voltage VOUT rises smoothly by a soft start function, it is possible to prevent an overshoot of the output voltage VOUT and an inrush current. Further, in the semiconductor device 100, for an output voltage tracking function, an internal reference voltage VREF can be externally input from an external power source by using the SS/REF terminal. Therefore, the internal reference voltage VREF can be set in an arbitrary voltage range after starting up to a predetermined target value (for example, 0.6 V).

The RGND terminal is a remote sense ground terminal. If a remote sense function is omitted, components connected to the RGND terminal may be connected to the AGND terminal.

The FB terminal is an output voltage feedback terminal. The FB terminal is connected to a connection node (=the application terminal of a feedback voltage VFB) between the resistors R3 and R4 connected in series between an application terminal of the output voltage VOUT and the ground terminal (=the RGND terminal). A target value of the output voltage VOUT can be set as $\{(R3+R4)/R4\} \times VREF$.

An EN terminal is an enable terminal. For example, when an enable voltage VEN applied to the EN terminal becomes equal to or higher than an upper threshold value (for example, 1.22 V), the semiconductor device 100 starts, and when the enable voltage VEN becomes equal to or lower than a lower threshold value (for example, 1.02 V), the semiconductor device 100 shuts down. Further, the EN terminal needs to be terminated. Further, it is desirable that the enable voltage VEN is started at the same time as the input voltage VIN is applied (VIN=VEN) or after the input voltage VIN is applied.

The PGD terminal is a power good terminal. Since the PGD terminal is of an open drain output type, the resistor R5 for pull-up is required. When the PGD terminal is not used, the PGD terminal may be in a floating state or connected to the ground.

The VIN terminal is a power input terminal. The capacitor C1 (for example, a ceramic capacitor of about 0.1 μF) for input smoothing is externally attached between the VIN terminal and the ground terminal (=the PGND terminal). The capacitor C1 is effective in reducing an input ripple noise and exerts the effect thereof by disposing the capacitor C1 as close as possible to the VIN terminal and the PGND terminal.

The SW terminal is a switching output terminal. The SW terminal is connected to a source of the upper transistor and a drain of a lower transistor (both not shown in FIG. 1) built in the semiconductor device 100 and outputs a switch voltage VSW in a rectangular waveform. The inductor L1 is externally attached between the SW terminal and the application terminal of the output voltage VOUT. Further, the capacitor C3 (for example, a ceramic capacitor) is externally attached between the application terminal of the output voltage VOUT and the RGND terminal. As described above, the switching power supply 1 requires an LC filter for output smoothing in order to supply a continuous current to a load.

The PGND terminal is a ground terminal of a switching output stage (=a power system circuit).

The VCC terminal is an internal power output terminal. The internal power supply voltage VCC (for example, 3 V) output from the VCC terminal is supplied to, for example, the control circuit (=the analog system circuit) of the semiconductor device 100. The capacitor C2 (for example, a ceramic capacitor of about 1 μF) is externally attached between the VCC terminal and the ground terminal (=the AGND terminal).

Semiconductor Device

Figure 2:
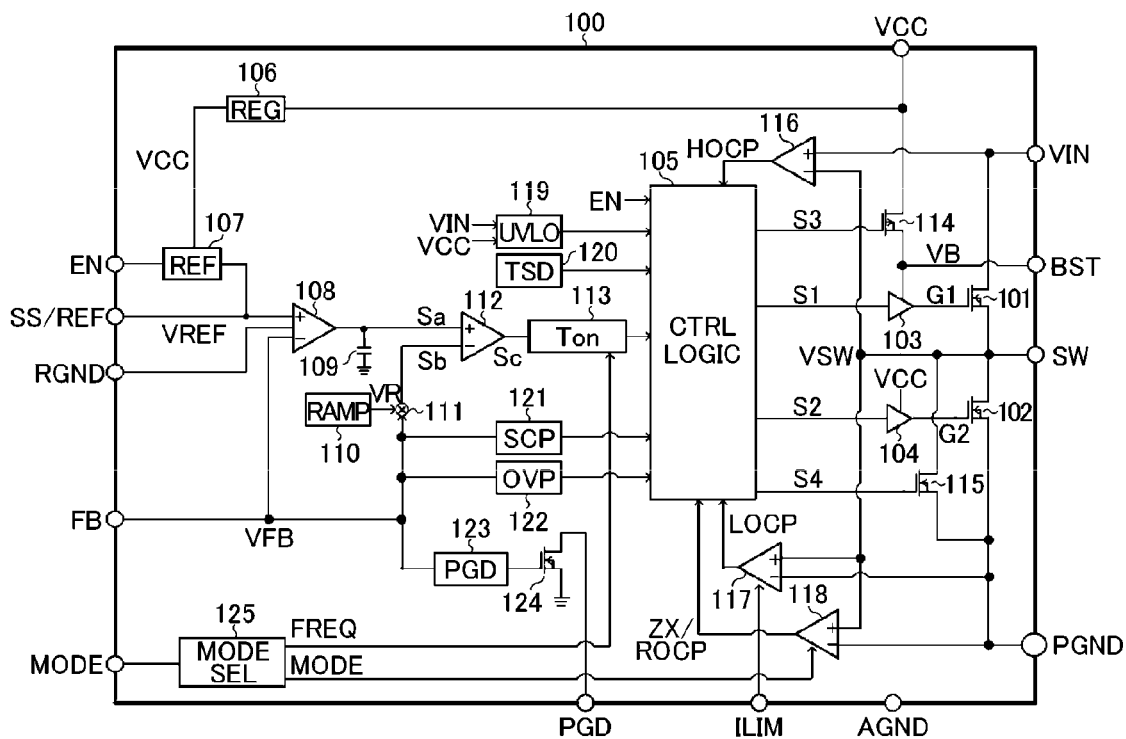
FIG. 2 is a diagram showing an internal configuration of a semiconductor device.

FIG. 2 is a diagram showing an internal configuration of the semiconductor device 100. The semiconductor device 100 of this configuration example includes an upper transistor 101, a lower transistor 102, an upper driver 103, a lower driver 104, a control logic 105, an internal power supply voltage generation circuit 106, an internal reference voltage generation circuit 107, an error amplifier 108, a phase compensation circuit 109, a ramp voltage generation circuit 110, a voltage superimposition circuit 111, a main comparator 112, an on-time setting circuit 113, a P-channel type MOS [Metal Oxide Semiconductor] field effect transistor 114, an N-channel type MOS field effect transistor 115, comparators 116, 117, and 118, a low input voltage malfunction prevention circuit 119, a temperature protection circuit 120, a load short-circuit protection circuit 121, an overvoltage protection circuit 122, a power good circuit 123, an N-channel type MOS field effect transistor 124, and a mode selector 125.

A drain of the upper transistor 101 (for example, an N-channel type MOS field effect transistor) is connected to the VIN terminal. A source of the upper transistor 101 is connected to the SW terminal. A gate of the upper transistor 101 is connected to the application terminal (=an output terminal of the upper driver 103) of an upper gate signal G1. The upper transistor 101 is turned on when the upper gate signal G1 is at a high level ($\cong$VB), and is turned off when the upper gate signal G1 is at a low level ($\cong$VSW).

A drain of the lower transistor 102 (for example, an N-channel type MOS field effect transistor) is connected to the SW terminal. A source of the lower transistor 102 is connected to the PGND terminal. A gate of the lower transistor 102 is connected to the application terminal (=an output end of the lower driver 104) of a lower gate signal G2. The lower transistor 102 is turned on when the lower gate signal G2 is at a high level ($\cong$VCC), and is turned off when the lower gate signal G2 is at a low level ($\cong$PGND).

The upper transistor 101 and the lower transistor 102 connected as described above form a step-down type switching output stage adopting a synchronous rectification method together with discrete components (the inductor L1 and the capacitor C3) externally attached to the semiconductor device 100. However, the rectification method is not necessarily limited to the synchronous rectification method, and may use a rectification diode instead of the lower transistor 102.

Further, when a large current output (for example, a maximum output of 20 A) is required for the switching power supply 1, it is desirable to use elements having a low on-resistance as the upper transistor 101 and the lower transistor 102.

Further, the upper transistor 101 and the lower transistor 102 do not necessarily have to be built in the semiconductor device 100, and may be externally attached to the semiconductor device 100 as discrete components.

The upper driver 103 operates by receiving a supply of the boot voltage VB and the switch voltage VSW, and generates the upper gate signal G1 based on an upper control signal S1 output from the control logic 105. For example, the upper driver 103 sets the upper gate signal G1 to a high level ($\cong$VB) when the upper control signal S1 is at a high level, and sets the upper gate signal G1 to a low level (≅VSW) when the upper control signal S1 is at a low level.

The lower driver 104 operates by receiving a supply of the internal power supply voltage VCC and the ground voltage PGND, and generates the lower gate signal G2 based on a lower control signal S2 output from the control logic 105. For example, the lower driver 104 sets the lower gate signal G2 to a high level (≅VCC) when the lower control signal S2 is at a high level, and sets the lower gate signal G2 to a low level (≅PGND) when the lower control signal S2 is at a low level.

The control logic 105 complementarily turns on and off the upper transistor 101 and the lower transistor 102 by a fixed on-time control method when an enable signal (=the enable voltage VEN) input to the EN terminal is at a high level.

More specifically, the control logic 105 sets the upper control signal S1 to the high level and the lower control signal S2 to the low level when the upper transistor 101 is turned on and the lower transistor 102 is turned off. Further, the control logic 105 sets the upper control signal S2 to the low level and the lower control signal S2 to the high level when the upper transistor 101 is turned off and the lower transistor 102 is turned on.

As described above, when the upper transistor 101 and the lower transistor 102 forming the switching output stage are complementarily turned on and off, the switch voltage VSW having the rectangular waveform (high level: VB, low level: PGND) is generated in the SW terminal. The switching power supply 1 can generate the desired output voltage VOUT by rectifying and smoothing the switch voltage VSW with the LC filter (=the inductor L1 and the capacitor C3).

In addition, the control logic 105 also has a function of preventing the upper transistor 101 and the lower transistor 102 from being turned on at the same time in order to prevent an excessive through-current. Further, the control logic 105 also has a function of forcibly stopping on/off drive of the upper transistor 101 and the lower transistor 102 based on various protection signals (HOCP, LOCP, ZX/ROCP, UVLO, TSD, SCP, and OVP signals). For example, the control logic 105 turns off both the upper transistor 101 and the lower transistor 102 by setting both the upper control signal S1 and the lower control signal S2 to a low level when an abnormality is detected.

The internal power supply voltage generation circuit 106 generates the internal power supply voltage VCC (for example, 3 V) and outputs it to the VCC terminal and each part of the semiconductor device 100.

The internal reference voltage generation circuit 107 generates a predetermined internal reference voltage VREF from the internal power supply voltage VCC when the enable signal (=the enable voltage VEN) input to the EN terminal is at a high level, and outputs it to the SS/REF terminal.

The error amplifier 108 operates with the RGND terminal as a reference potential and generates an error signal Sa corresponding to a difference between the internal reference voltage VREF input to a non-inverting input end (+) of the error amplifier 108 and the feedback voltage VFB input to an inverting input terminal (−) thereof. Therefore, the error signal Sa increases when VREF>VFB, and decreases when VREF<VFB.

The phase compensation circuit 109 is a functional part for preventing oscillation of the error amplifier 108 and includes, for example, a capacitor connected between the output terminal of the error amplifier 108 and the ground terminal.

The ramp voltage generation circuit 110 generates a ramp voltage VR having a saw waveform or a triangular waveform.

The voltage superimposition circuit 111 superimposes the lamp voltage VR on the feedback voltage VFB to generate a slope signal Sb.

The main comparator 112 generates a comparison signal Sc by comparing the error signal Sa input to a non-inverting input end (+) of the main comparator 112 with the slope signal Sb input to an inverting input terminal (−) thereof, and outputs it to the on-time setting circuit 113. The comparison signal Sc has a high level when Sa>Sb, and has a low level when Sa<Sb. That is, the main comparator 112 feeds back to the on-time setting circuit 113 that the output voltage VOUT has dropped below the target value by raising the comparison signal Sc to the high level.

The on-time setting circuit 113 sets a predetermined on-time Ton when the comparison signal Sc rises to the high level. The control logic 105 turns on the upper transistor 101 and turns off the lower transistor 102 until the on-time Ton elapses.

As described above, among the aforementioned components, the error amplifier 108, the main comparator 112, and the on-time setting circuit 113 form an output feedback control circuit that performs drive control of the switching output stage in a fixed on-time control method so that the feedback voltage VFB matches the internal reference voltage VREF.

However, the output feedback control method is not necessarily limited to the fixed on-time control method, and may adopt a voltage mode control method, a current mode control method, a hysteresis control method (ripple control method), or the like.

A drain of the transistor 114 is connected to the VCC terminal (=the application terminal of the internal power supply voltage VCC). Further, a source of the transistor 114 is connected to the BST terminal (=the application terminal of the boot voltage VB). The transistor 114 connected as described above forms a bootstrap circuit together with the capacitor C4 externally attached between the BST terminal and the SW terminal.

The transistor 114 is turned on when a control signal S3 (=a binary signal having basically the same logic level as the control signal S1) input from the control logic 105 to a gate of the transistor 114 is at a low level, and is turned off when the control signal S3 is at a high level.

The bootstrap circuit described above generates the boot voltage VB (≅VSW+VCC) which is always higher than the switch voltage VSW by a voltage across the capacitor C4 (≅VCC). That is, the boot voltage VB is VB≅VIN+VCC during a high level period (VSW≅VIN) of the switch voltage VSW, and is VB≅VCC during a low level period (VSW≅PGND) of the switch voltage VSW.

The boot voltage VB generated as described above is supplied to the upper driver 103 and is used as the high level (=a gate voltage for turning on the upper transistor 101) of the upper gate signal G1. Therefore, during an ON period of the upper transistor 101, since the high level (≅VB) of the upper gate signal G1 rises to a voltage value (≅VIN+VCC) which is higher than the high level (VIN) of the switch voltage VSW, it is possible to increase a gate-source voltage of the upper transistor 101 to ensure turning on the upper transistor 101.

In addition, as a component of the bootstrap circuit, a diode having an anode connected to the VCC terminal and a cathode connected to the BST terminal may be used instead of the transistor 114. In this case, the boot voltage VB is VB≅VSW+VCC−Vf (where Vf is a forward voltage drop of the diode).

A drain of the transistor 115 is connected to the SW terminal (=the application terminal of the switch voltage VSW). A source of the transistor 115 is connected to the PGND terminal (=the ground terminal of the power system circuit). The transistor 115 is turned on when a control signal S4 input to a gate of the transistor 115 from the control logic 105 is at a high level, and is turned off when the control signal S4 is at a low level.

The transistor 115 connected as described above functions as a resistance load (for example, 80Ω) for discharging the capacitor C3 for output smoothing when the semiconductor device 100 in an operating state is shut down by an enable control. That is, when both the upper transistor 101 and the lower transistor 102 are turned off by shutting down the semiconductor device 100, the transistor 115 may be turned on. The output voltage VOUT may be discharged, for example, up to 10% of the target value.

The comparator 116 monitors a voltage (=VIN−VSW) across the upper transistor 101 each switching cycle and generates an upper overcurrent detection signal HOCP. When a current flowing through the upper transistor 101 reaches an overcurrent detection value IOCPH while the upper transistor 101 is turned on, the upper overcurrent detection signal HOCP becomes a high level. At this time, the control logic 105 turns off the upper transistor 101 and turns on the lower transistor 102.

The comparator 117 monitors a voltage (=VSW) across the lower transistor 102 each switching cycle and generates a lower overcurrent detection signal LOCP. When a current flowing through the lower transistor 102 reaches an overcurrent detection value IOCPL while the lower transistor 102 is turned on, the lower overcurrent detection signal LOCP becomes a high level. At this time, the control logic 105 turns off the upper transistor 101 to keep the lower transistor 102 turned on even when the feedback voltage FB falls below the internal reference voltage VREF. Thereafter, when the current flowing through the lower transistor 102 falls below an upper limit value, it is possible to turn on the upper transistor 101.

The comparator 118 monitors a voltage (=VSW) across the lower transistor 102 each switching cycle and generates a zero cross/sink (reverse) overcurrent detection signal ZX/ROCP. For example, in the light load mode, the control logic 105 detects a zero cross timing of the current flowing through the lower transistor 102 when the lower transistor 102 is turned on, and turns off the lower transistor 102. Further, in the fixed PWM mode, the control logic 105 detects that a sink current (reverse current) flowing from the SW terminal toward the lower transistor 102 when the lower transistor 102 is turned on has reached an upper limit value, and turns off the lower transistor 102 and turns on the upper transistor 101.

The low input voltage malfunction prevention circuit 119 monitors the input voltage VIN and the internal power supply voltage VCC to apply UVLO [Under Voltage Lock Out] protection. For example, when the input voltage VIN is 1.85 V or less or the internal power supply voltage VCC is 2.5 V or less, the semiconductor device 100 is shut down. On the other hand, when the input voltage VIN is 2.4 V or more and the internal power supply voltage VCC is 2.8 V or more, the semiconductor device 100 starts.

The temperature protection circuit 120 monitors a junction temperature Tj of the semiconductor device 100 and applies temperature protection. For example, when the junction temperature Tj becomes 175 degrees C. or higher, the semiconductor device 100 is shut down. Thereafter, when the junction temperature Tj becomes 150 degrees C. or lower (hysteresis 25 degrees C.), the semiconductor device 100 automatically restarts.

The load short-circuit protection circuit 121 monitors the feedback voltage VFB and the overcurrent protection state to apply load short-circuit protection. For example, after the semiconductor device 100 starts, when the feedback voltage VFB is 80% or less of the internal reference voltage VREF or when overcurrent protection is continuously applied over a plurality of switching cycles (for example, 31 cycles), the semiconductor device 100 is shut down. In addition, when 117 ms elapses after the shutdown, the semiconductor device 100 automatically restarts.

The overvoltage protection circuit 122 monitors the feedback voltage VFB to apply overvoltage protection. For example, when the feedback voltage VFB is 116% or more of the internal reference voltage VREF, the lower transistor 102 is turned on to suppress an increase of the output voltage VOUT. Thereafter, when the feedback voltage VFB is 105% or less of the internal reference voltage VREF, a normal operating state is restored.

The power good circuit 123 monitors the feedback voltage VFB to perform an on/off control of the transistor 124 (and thus an output control of a power good signal PGD). For example, when the output voltage VOUT reaches 92.5% to 105% of a target value and such a state continues for 0.9 ms, the transistor 124 is turned off. On the other hand, when the output voltage VOUT is 116% or more or 80% or less of the target value, the transistor 124 is turned on.

A drain of the transistor 124 is connected to the PGD terminal. A source of the transistor 124 is connected to the ground terminal (=the AGND terminal). The transistor 124 is turned on and off by the power good circuit 123 as described above. When the transistor 124 is turned on, the PGD terminal is in a high impedance state. On the other hand, when the transistor 124 is turned off, the PGD terminal is pulled down to the ground terminal. By providing such a power good function, it is possible to perform a sequence control of the entire system.

The mode selector 125 sets a switching frequency FREQ and an operation mode MODE according to a state of the MODE terminal. When the light load mode is selected as the operation mode, a switching operation is performed by a PWM mode control in a heavy load state, and by an LLM [Light Load Mode] mode control in a light load state in order to improve the efficiency. On the other hand, when the fixed PWM mode is selected as the operation mode, the switching operation is forcibly performed by the PWM mode control regardless of a weight of a load. Since the efficiency in a light load region is improved in the light load mode, the light load mode is appropriate for equipment that requires suppressing standby power consumption.

Internal Reference Voltage Generation Circuit (First Embodiment)

Figure 3:
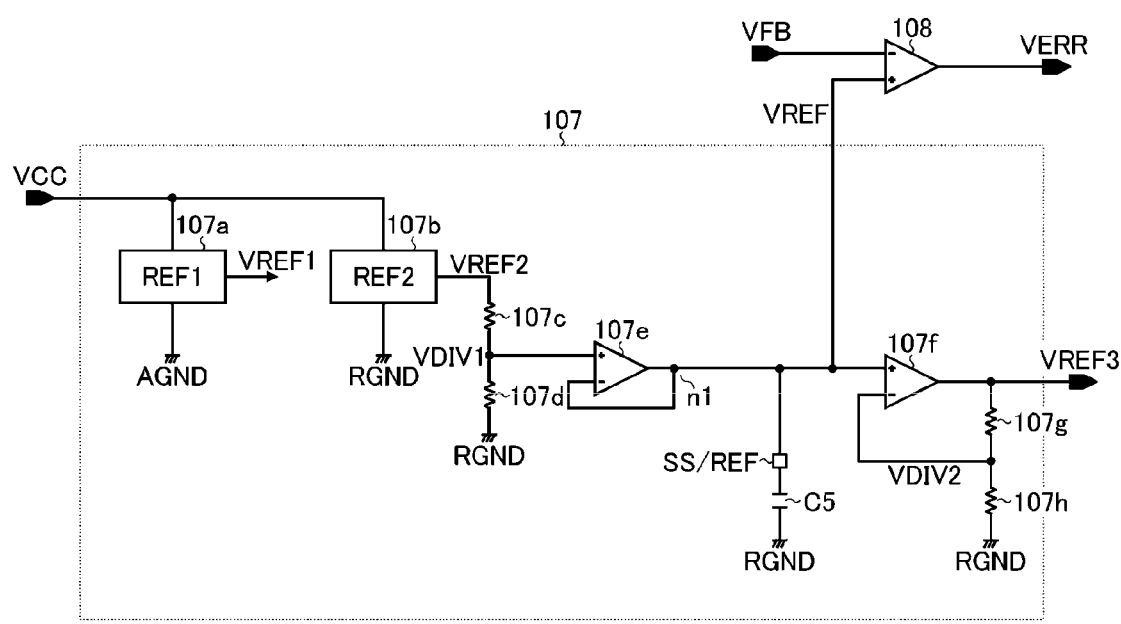
FIG. 3 is a diagram showing an internal reference voltage generation circuit according to a first embodiment.

FIG. 3 is a diagram showing the internal reference voltage generation circuit 107 according to a first embodiment. The internal reference voltage generation circuit 107 of the first embodiment includes a first internal reference voltage generator 107a, a second internal reference voltage generator 107b, resistors 107c and 107d, operational amplifiers 107e and 107f, and resistors 107g and 107h.

The first internal reference voltage generator 107a operates with the AGND terminal as a reference potential and generates an internal reference voltage VREF1 (for example, 1.2 V) from the internal power supply voltage VCC (for example, 3 V). The first internal reference voltage VREF1 is output to the low input voltage malfunction prevention circuit 119, the temperature protection circuit 120, and the like.

The second internal reference voltage generator 107b operates with the RGND terminal as a reference potential and generates an internal reference voltage VREF2 (for example, 1.2 V) from the internal power supply voltage VCC (for example, 3 V).

The resistors 107c and 107d are connected in series between an application terminal of the internal reference voltage VREF2 and the ground terminal (=the RGND terminal), and output a divided voltage VDIV1 (for example, 0.6 V) from a connection node therebetween. The resistors 107c and 107d may have a function of finely adjusting resistance values thereof (for example, a trimming function). Further, a resistor ladder capable of drawing out a plurality of divided voltages may be used instead of the resistors 107c and 107d.

A non-inverting input terminal (+) of the operational amplifier 107e is connected to an application terminal (=the connection node between the resistors 107c and 107d) of the divided voltage VDIV1. An output terminal and an inverting input terminal (−) of the operational amplifier 107e are connected in common to a node n1. The operational amplifier 107e connected as described above functions as a buffer amplifier that outputs the divided voltage VDIV1 as the internal reference voltage VREF to the subsequent stage.

In the internal reference voltage generation circuit 107 of the first embodiment, the node n1 is directly connected to the SS/REF terminal.

A non-inverting input terminal (+) of the operational amplifier 107f is connected to the SS/REF terminal. An inverting input terminal (−) of the operational amplifier 107f is connected to an application terminal (=a connection node between the resistors 107g and 107h) of a divided voltage VDIV2. An output terminal of the operational amplifier 107f is connected to an output terminal of an internal reference voltage VREF3 (for example, 1.2 V).

The resistors 107g and 107h are connected in series between an application terminal of the internal reference voltage VREF3 and the ground terminal (=the RGND terminal), and output the divided voltage VDIV2 (for example, 0.6 V) from the connection node therebetween. The resistors 107g and 107h may have a function of finely adjusting resistance values thereof (for example, a trimming function). Further, a resistor ladder capable of drawing out a plurality of internal reference voltages may be used instead of the resistors 107g and 107h.

Figure 4:
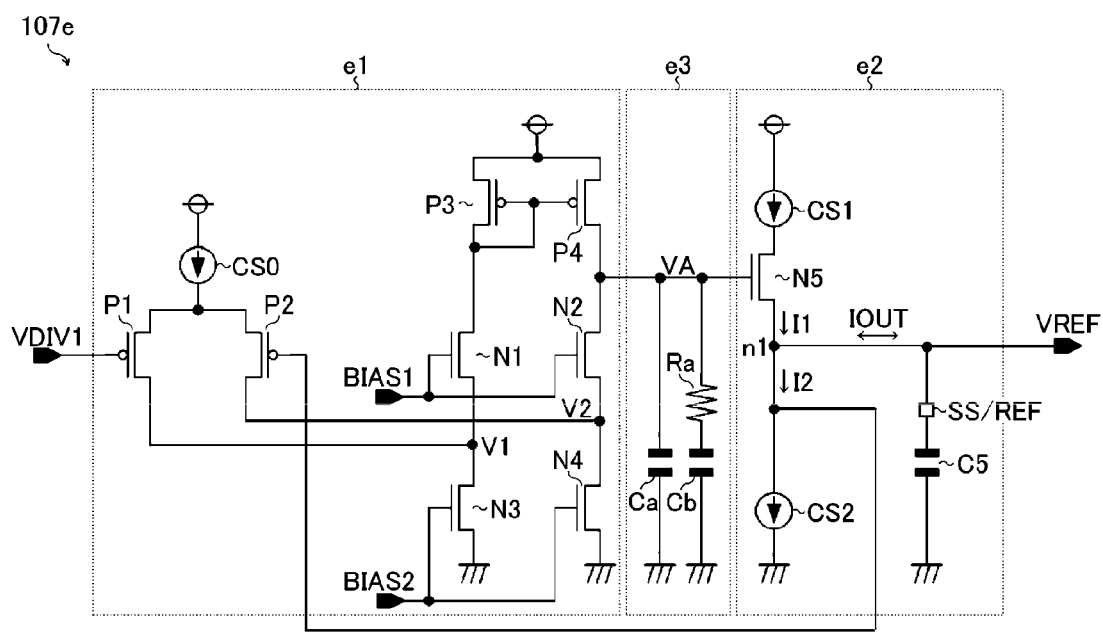
FIG. 4 is a diagram showing a configuration example of an operational amplifier in the first embodiment.

FIG. 4 is a diagram showing a configuration example of the operational amplifier 107e in the first embodiment. The operational amplifier 107e of this configuration example includes an input stage e1, an output stage e2, and a phase compensator e3.

The input stage e1 is a so-called PMOS input type folded cascode circuit and includes P-channel type MOS field effect transistors P1 to P4, N-channel type MOS field effect transistors N1 to N4, and a current source CS0.

A first terminal of the current source CS0 is connected to a power supply terminal. A second terminal of the current source CS0 is connected to a source of each of the transistors P1 and P2. A gate of the transistor P1 is connected to the application terminal of the divided voltage VDIV1 as the non-inverting input terminal (+) of the operational amplifier 107e. On the other hand, a gate of the transistor P2 is connected to the node n1 (and thus the SS/REF terminal at which the internal reference voltage VREF appears) as the inverting input terminal (−) of the operational amplifier 107e.

Sources of the transistors P3 and P4 are both connected to the power supply terminal. Gates of the transistors P3 and P4 are both connected to a drain of the transistor P3. Drains of the transistors P3 and P4 are connected to drains of the transistors N1 and N2, respectively. Gates of the transistors N1 and N2 are both connected to an application terminal of a bias voltage BIAS1. The drain of each of the transistors N2 and P4 corresponds to an output terminal of a node voltage VA.

A source of the transistor N1 and a drain of the transistor N3 are both connected to the drain of the transistor P1. A source of the transistor N2 and a drain of the transistor N4 are both connected to the drain of the transistor P2. Gates of the transistors N3 and N4 are both connected to an application terminal of a bias voltage BIAS2. Sources of the transistors N3 and N4 are both connected to the ground terminal.

As described above, by using the folded cascode circuit as the input stage e1, it is possible to obtain a gain equivalent to that of an amplification stage having a two-stage configuration.

The output stage e2 is a so-called NMOS output type source follower and includes an N-channel type MOS field effect transistor N5 (corresponding to an output transistor) and current sources CS1 and CS2. In FIG. 4, for the sake of convenience of explanation, an external capacitor C5 is included as a component of the output stage e3.

A first terminal of the current source CS1 is connected to a power supply terminal. A second terminal of the current source CS1 is connected to a drain of the transistor N5. A gate of the transistor N5 is connected to an application terminal (=the drain of each of the transistors N2 and P4) of the node voltage VA. A source of the transistor N5 and a first terminal of the current source CS2 are both connected to the node n1. A second terminal of the current source CS2 is connected to the ground terminal. The node n1 is directly connected to an output node (=the SS/REF terminal) of the internal reference voltage VREF.

As described above, by using the source follower as the output stage e2, the output node (=the SS/REF terminal) of the internal reference voltage VREF has a low impedance. Therefore, it is possible to shift a pole of the operational amplifier 107e to a high frequency side.

When an emitter follower is used instead of the source follower, for example, the transistor N5 may be replaced with an npn type bipolar transistor. In that case, it is sufficient to read and understand "source," "drain," and "gate" in the above description as "emitter," "collector," and "base," respectively.

The current source CS1 generates a source current I1 to flow into the node n1 via the transistor N5. On the other hand, the current source CS2 generates a sink current I2 to be drawn from the node n1 toward the ground terminal. Here, the source current I1 has a variable value (for example, 0 to 48 μA) that changes from a minimum value I1min to a maximum value I1max according to a conductivity of the transistor N5. On the other hand, the sink current I2 has a fixed value (for example, 12 μA) larger than the minimum value I1min of the source current I1 and smaller than the maximum value I1max of the source current I1.

Therefore, given that a direction from the node n1 toward the output terminal of the internal reference voltage VREF is positive, when a difference obtained by subtracting the sink current I2 from the maximum value I1max of the source current I1 is Iso (>0) and a difference obtained by subtracting the sink current I2 from the minimum value I1min of the source current I1 Isi (<0), an output current IOUT (=I1−I2) flowing through the output node (=the SS/REF terminal) of the internal reference voltage VREF changes within a predetermined output range of Isi to Iso (for example, −12 µA to +36 µA).

The phase compensator e3 includes capacitors Ca and Cb and a resistor Ra, which are provided between the output terminal of the input stage e1 and the input terminal of the output stage e2. Regarding a connection relationship, first terminals of the capacitor Ca and the resistor Ra are both connected to the application terminal of the node voltage VA (=the drain of each of the transistors N2 and P4). A second terminal of the resistor Ra is connected to a first terminal of the capacitor Cb. Second terminals of the capacitors Ca and Cb are both connected to the ground terminal.

In the operational amplifier 107e of this configuration example, the node voltage VA output from the connection node of the transistors N2 and P4 is controlled so that node voltages V1 and V2 appearing at the drains of the transistors P1 and P2, respectively, coincide with each other.

That is, the conductivity of the transistor N5 is controlled so that the source current I1 flowing from the current source CS1 to the node n1 via the transistor N5 and the sink current I2 drawn from the node n1 into the current source CS2 are in a balanced state (IOUT=0).

As a result, in an output equilibrium state (steady state) of the operational amplifier 107e, the divided voltage VDIV1 input to the gate of the transistor P1 and the internal reference voltage VREF input to the gate of the transistor P2 coincide with each other.

Figure 5:
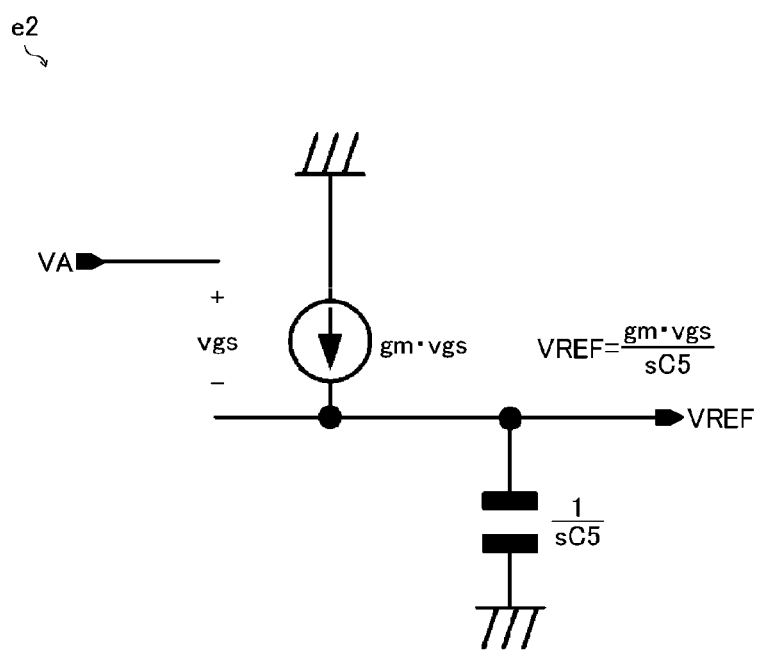
FIG. 5 is a diagram equivalently showing an output stage of the operational amplifier in the first embodiment.

FIG. 5 is a diagram equivalently showing the output stage e2 of the operational amplifier 107e in the first embodiment. In FIG. 5, reference symbols Vgs and gm indicate a gate-source voltage and a transconductance of the transistor N5, respectively. Further, reference symbol C5 indicates a capacitance value of the capacitor C5.

When designing the operational amplifier 107e, it is necessary to secure a sufficient phase margin while obtaining a desired gain. Therefore, ideally, it is desirable that the operational amplifier 107e has a circuit design having a single pole. Specifically, it is desirable that the only pole of the output stage e3 is the gate of the transistor N5 (=the application terminal of the node voltage VA) which has a high impedance in order to acquire the desired gain.

However, in the operational amplifier 107e of the first embodiment, the output node (=the SS/REF terminal) of the internal reference voltage VREF is directly connected to the inverting input terminal (−) of the operational amplifier 107e as a feedback node. Therefore, the internal reference voltage VREF is expressed by the following Equation (1) from the node voltage VA.

$$\frac{VREF}{VA} = \frac{1}{1 + s\frac{C5}{gm}} \qquad \text{Equation (1)}$$

It can be recognized from the above Equation (1) that in the operational amplifier 107e of the first embodiment, poles are generated not only at the gate of the transistor N5 (=the application terminal of the node voltage VA) but also at the output node (=the SS/REF terminal) of the internal reference voltage VREF. When two or more poles are present in the operational amplifier 107e as described above, it is necessary to suppress oscillation by creating a zero point, or the like.

In addition, as described above, by using the source follower as the output stage e2, since the output node (=the SS/REF terminal) of the internal reference voltage VREF can have a low impedance, it is possible to shift the pole of the output node to a high frequency side.

However, when the capacitance value of the capacitor C5 externally attached to the SS/REF terminal is large, the pole of the output node is shifted to a low frequency side. As a result, a sufficient phase margin cannot be secured, and in the worst case, the operational amplifier 107e oscillates.

Figure 6:
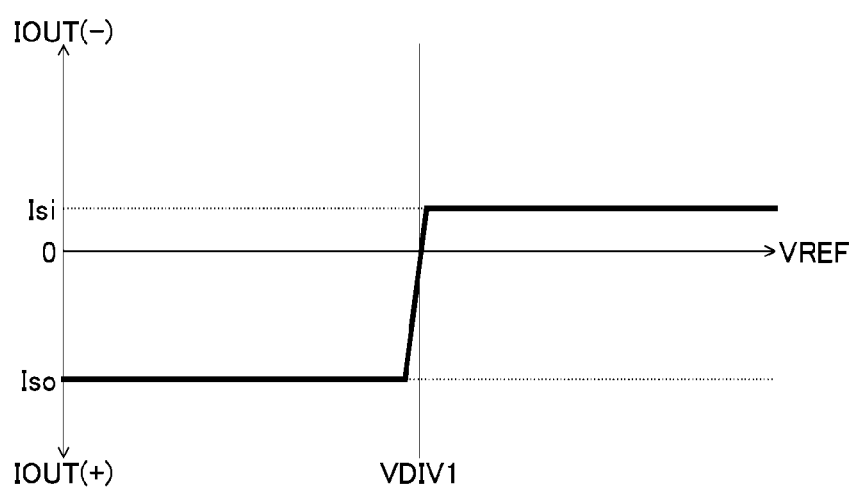
FIG. 6 is a diagram showing output characteristics of the operational amplifier in the first embodiment.

FIG. 6 is a diagram showing output characteristics of the operational amplifier 107e in the first embodiment. The horizontal axis represents the internal reference voltage VREF, and the vertical axis represents the output current IOUT.

As shown in FIG. 6, the output current IOUT changes within a predetermined output range of Isi to Iso (for example, −12 µA to +36 µA) so as to be 0 A in the output equilibrium state (VREF=VDIV1) of the operational amplifier 107e. The output range of Isi to Iso of the output current IOUT can be arbitrarily adjusted by using the current sources CS1 and CS2 introduced in the output stage e2.

However, in the operational amplifier 107e of the first embodiment, a slope (=an amount of change with respect to the internal reference voltage VREF) of the output current IOUT is large, and there is a possibility that the internal reference voltage VREF may overshoot when the semiconductor device 100 starts.

In the following, there is proposed a second embodiment that can provide an appropriate slope to the output current IOUT while sufficiently securing the phase margin of the operational amplifier 107e.

Internal Reference Voltage Generation Circuit
(Second Embodiment)

Figure 7:
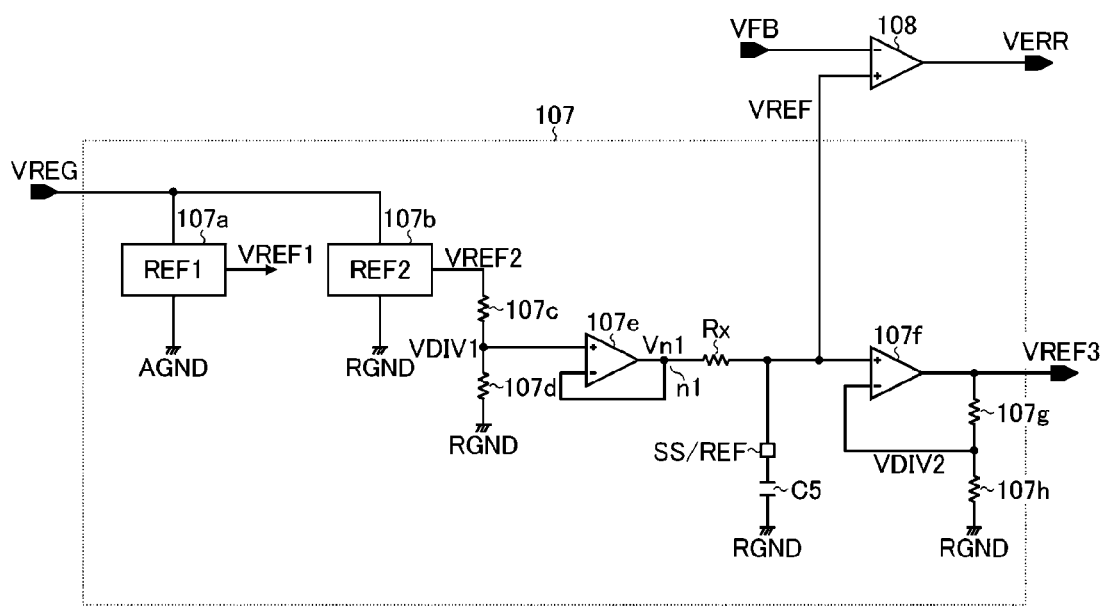
FIG. 7 is a diagram showing an internal reference voltage generation circuit according to a second embodiment.

FIG. 7 is a diagram showing an internal reference voltage generation circuit 107 according to a second embodiment. The internal reference voltage generation circuit 107 of the second embodiment is based on the first embodiment (see FIG. 3), and further includes a resistor Rx. Therefore, the above-mentioned components will be denoted by the same reference numerals as those in FIG. 3, and redundant explanation thereof will be omitted. Hereinafter, features of the second embodiment will be mainly described.

As shown in FIG. 7, the resistor Rx is connected between the node n1, to which the output terminal and the inverting input terminal (−) of the operational amplifier 107e are connected in common, and the SS/REF terminal. That is, a node voltage Vn1 of the node n1, instead of the internal reference voltage VREF, is negatively fed back and input to the inverting input terminal (−) (=the gate of the transistor P2) of the operational amplifier 107e. A resistance value of the resistor Rx may be designed to be about 1 kΩ.

Figure 8:
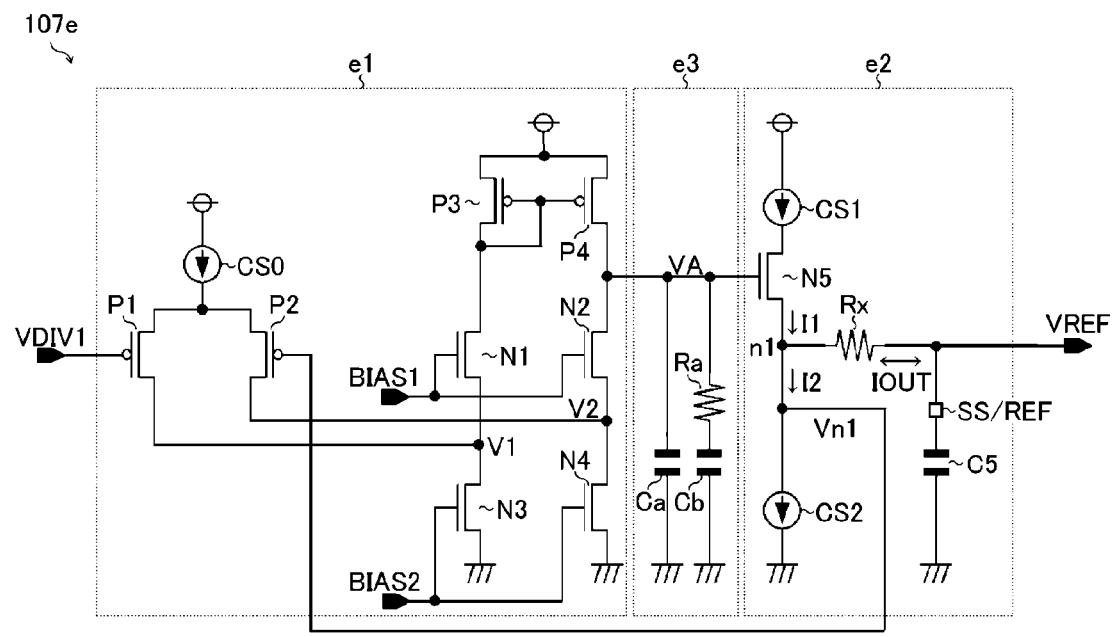
FIG. 8 is a diagram showing a configuration example of an operational amplifier in the second embodiment.

FIG. 8 is a diagram showing a configuration example of the operational amplifier 107e in the second embodiment. The operational amplifier 107e of this configuration example has basically the same configuration as that of FIG. 4 described above, and has the resistor Rx connected between the node n1, to which the output terminal and the inverting input terminal (−) of the operational amplifier 107e are connected in common, and the SS/REF terminal. In FIG. 8, for the sake of convenience of explanation, the resistor Rx newly added in the second embodiment is included as a component of the output stage e3.

Figure 9:
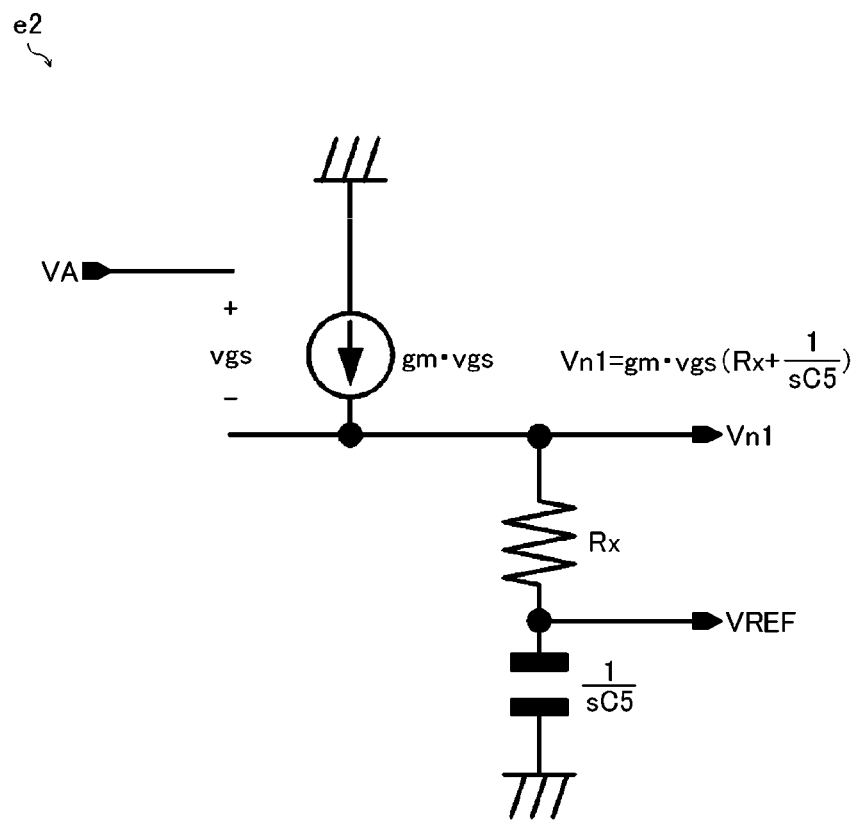
FIG. 9 is a diagram equivalently showing an output stage of the operational amplifier in the second embodiment.

FIG. 9 is a diagram equivalently showing the output stage e2 of the operational amplifier 107e in the second embodiment. In FIG. 9, reference symbols Vgs and gm indicate the gate-source voltage and the transconductance of the transistor N5, respectively. Further, reference symbol C5 indicates the capacitance value of the capacitor C5, and reference symbol Rx indicates the resistance value of the resistor Rx.

In the operational amplifier 107e of the second embodiment, the output node (=the SS/REF terminal) of the internal reference voltage VREF and the feedback node are separated by introducing the resistor Rx. Explaining in line with FIG. 9, instead of the internal reference voltage VREF drawn from a downstream side of the resistor Rx, the node voltage Vn1 drawn from an upstream side of the resistor Rx is negatively fed back and input to the inverting input terminal (−) (=the gate of the transistor P2) of the operational amplifier 107e. The node voltage Vn1 is expressed by the following Equation (2) from the node voltage VA.

$$\frac{Vn1}{VA} = \frac{1 + sC5 \cdot Rx}{1 + \left(\frac{1}{gm} + Rx\right) \cdot sC5} \quad \text{Equation (2)}$$

It can be recognized from the above Equation (2) that in the operational amplifier 107e of the second embodiment, a pole and a zero point are generated at the output node (=the SS/REF terminal) of the internal reference voltage VREF. Therefore, since phase lead and phase lag cancel each other out, it is possible to sufficiently secure a phase margin of the operational amplifier 107e. As a result, it is possible to expand a specification range of the capacitor C5 that can be externally attached to the SS/REF terminal.

At a glance, the resistor Rx and the capacitor C5 seem to form an RC filter. However, the resistor Rx is not intended for canceling a noise of the internal reference voltage VREF, but is intentionally introduced for the purpose of generating a zero point with an open loop characteristic. The former and the latter have completely different technical significance. As a reference value, the resistor Rx may have about 1 kΩ and the capacitor C5 may have about 1,000 pF to μg.

Figure 10:
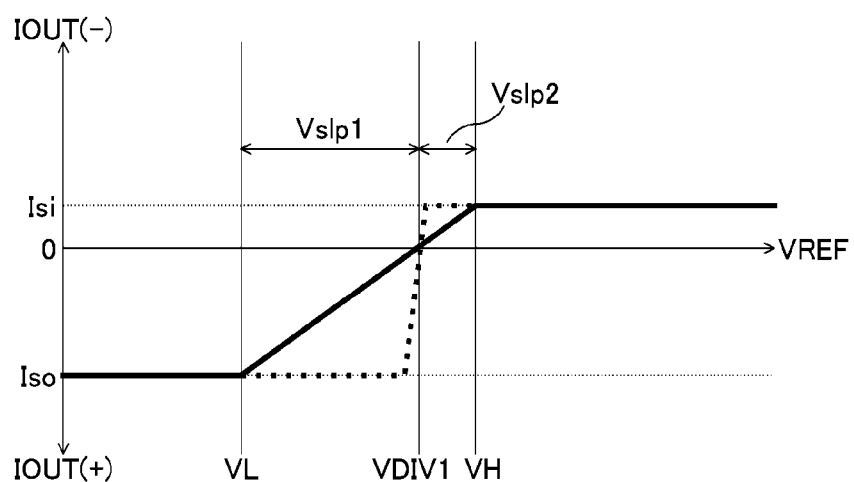
FIG. 10 is a diagram showing output characteristics of the operational amplifier in the second embodiment.

FIG. 10 is a diagram showing output characteristics of the operational amplifier 107e in the second embodiment. Similar to FIG. 6 described above, the horizontal axis represents the internal reference voltage VREF, and the vertical axis represents the output current IOUT.

As shown in FIG. 10, in the operational amplifier 107e of the second embodiment, with the introduction of the resistor Rx, the slope (=the amount of change with respect to the internal reference voltage VREF) of the output current IOUT can be made gentler than that of the first embodiment (see FIG. 6) described above.

Explaining in line with FIG. 10, when VREF<VL (<VDIV1), the conductivity of the transistor N5 forming the output stage e3 is raised to a maximum value, and the output current IOUT is fixed to a positive maximum value Iso (=I1max−I2).

On the other hand, when VL<VREF<VH, the conductivity of the transistor N5 is gradually lowered. As a result, the output current IOUT changes within a predetermined output range of Isi to Iso (for example, −12 μA to +36 μA) so as to be 0 A in the output equilibrium state (VREF=VDIV1) of the operational amplifier 107e.

Further, when (VDIV1<) VH<VREF, the conductivity of the transistor N5 is lowered to a minimum value, and the output current IOUT is fixed to a negative maximum value Isi (=I1min−I2).

Therefore, as the internal reference voltage REF approaches the divided voltage VDIV1, the output current IOUT gradually decreases, so that it is possible to suppress the overshoot of the internal reference voltage VREF at the time of starting the semiconductor device 100.

In addition, reference symbol Vslp1 in FIG. 10 indicates an amount of change (=VDIV1−VL) of the internal reference voltage VREF generated while the output current IOUT changes from the positive maximum value Iso to zero, that is, while the source current I1 decreases from the maximum value I1max to the same value as the sink current I2. At this time, a relationship of Vslp1=Rx×|Iso| (where |Iso| is an absolute value of the positive maximum value Iso) is established. Therefore, it is possible to determine the resistance value of the resistor Rx from the same equation.

In addition, reference symbol Vslp2 in FIG. 10 indicates an amount of change (=VH−VDIV1) of the internal reference voltage VREF generated while the output current IOUT changes from zero to the negative maximum value Isi, that is, while the source current I1 decreases from the same value as the sink current I2 to the minimum value I1min. At this time, a relationship of Vslp2=Rx×|Isi| (where |Isi| is an absolute value of the negative maximum value Isi) is established. Therefore, it is possible to determine the resistance value of the resistor Rx from the same equation.

In addition, when |Iso|=|Isi|, Vslp1=Vslp2, and thus the resistance value of the resistor Rx can be determined by using any of the equations.

Summary

In the following, the various embodiments described above will be comprehensively described.

For example, a semiconductor device disclosed in the present disclosure includes an operational amplifier, an external terminal configured to be attached to an external capacitor, and a resistor configured to be connected between a node, to which an output terminal and an inverting input terminal of the operational amplifier are connected in common, and the external terminal (first configuration).

In the semiconductor device of the first configuration, the operational amplifier may include an input stage configured by using a folded cascode circuit, and an output stage configured by using a source follower or an emitter follower (second configuration).

In addition, in the semiconductor device of the second configuration, the operational amplifier may further include a phase compensator configured to be provided between an output terminal of the input stage and an input terminal of the output stage (third configuration).

In addition, in the semiconductor device of the second or third configuration, the output stage may include an output transistor configured to form the source follower or the emitter follower, a first current source configured to generate a source current flowing into the node via the output transistor, and a second current source configured to generate a sink current drawn from the node (fourth configuration).

In the semiconductor device of the fourth configuration, the source current may have a variable value that changes from a minimum value to a maximum value according to a conductivity of the output transistor, and the sink current may have a fixed value that is larger than the minimum value of the source current and is smaller than the maximum value of the source current (fifth configuration).

Further, in the semiconductor device of the fifth configuration, when an absolute value of a difference obtained by subtracting the sink current from the maximum value of the source current is |Iso|, a relationship of Vslp1=Rx×|Iso| may be established, where Vslp1 denotes an amount of change of a voltage generated in the external terminal while the source current decreases from the maximum value to the same value as the sink current, and where Rx denotes a resistance value of the resistor (sixth configuration).

In addition, in the semiconductor device of the fifth or sixth configuration, when an absolute value of a difference obtained by subtracting the sink current from the minimum value of the source current is a relationship of Vslp2=Rx× |Isi| may be established, where Vslp2 denotes an amount of change of a voltage generated in the external terminal while the source current decreases from the same value as the sink current to the minimum value, and where Rx denotes a resistance value of the resistor (seventh configuration).

In addition, the semiconductor device of any one of the first to seventh configurations may use a terminal voltage appearing at the external terminal as an internal reference voltage (eighth configuration).

In addition, the semiconductor device of the eighth configuration may further include an output feedback control circuit configured to drive and control a switching output stage so that a feedback voltage according to an output voltage of a switching power supply matches the internal reference voltage (ninth configuration).

In addition, a switching power supply disclosed in the present disclosure includes the semiconductor device of the ninth configuration, and the switching output stage configured to generate the output voltage from an input voltage (tenth configuration).

Other Modifications

In addition to the above-described embodiments, various technical features disclosed in the present disclosure can be modified in various ways without departing from the gist of the technical creation. For example, mutual replacement between a bipolar transistor and a MOS field effect transistor and logic level inversion of various signals are arbitrary. That is, the above-described embodiments are exemplary and are not restrictive in all respects, and it should be considered that the technical scope of the present disclosure is not limited to the above-described embodiments and includes all changes belonging to the meaning and scope equivalent to the claims.

According to the present disclosure in some embodiments, it is possible to provide a semiconductor device capable of securing a phase margin of an operational amplifier, and a switching power supply using the same.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
an operational amplifier;
an external terminal configured to be attached to an external capacitor; and
a resistor configured to be connected between a node, to which an output terminal and an inverting input terminal of the operational amplifier are connected in common, and the external terminal,
wherein the operational amplifier includes an output stage configured by using a source follower or an emitter follower,
wherein the output stage includes:
an output transistor configured to form the source follower or the emitter follower;
a first current source configured to generate a source current flowing into the node via the output transistor; and
a second current source configured to generate a sink current drawn from the node,
wherein the source current has a variable value that changes from a minimum value to a maximum value according to a conductivity of the output transistor, and
wherein the sink current has a fixed value that is larger than the minimum value of the source current and is smaller than the maximum value of the source current.

2. The semiconductor device of claim 1, wherein the operational amplifier further includes
an input stage configured by using a folded cascode circuit.

3. The semiconductor device of claim 2, wherein the operational amplifier further includes a phase compensator configured to be provided between an output terminal of the input stage and an input terminal of the output stage.

4. The semiconductor device of claim 1, wherein when an absolute value of a difference obtained by subtracting the sink current from the maximum value of the source current is |Iso|, a relationship of Vslp1=Rx×|Iso| is established, where Vslp1 denotes an amount of change of a voltage generated in the external terminal while the source current decreases from the maximum value to the same value as the sink current, and where Rx denotes a resistance value of the resistor.

5. The semiconductor device of claim 1, wherein when an absolute value of a difference obtained by subtracting the sink current from the minimum value of the source current is |Isi|, a relationship of Vslp2=Rx×|Isi| is established, where Vslp2 denotes an amount of change of a voltage generated in the external terminal while the source current decreases from the same value as the sink current to the minimum value, and where Rx denotes a resistance value of the resistor.

6. The semiconductor device of claim 1, wherein a terminal voltage appearing at the external terminal is used as an internal reference voltage.

7. The semiconductor device of claim 6, further comprising an output feedback control circuit configured to drive and control a switching output stage so that a feedback voltage according to an output voltage of a switching power supply matches the internal reference voltage.

8. A switching power supply comprising:
the conductor device of claim 7; and
the switching output stage configured to generate the output voltage from an input voltage.

* * * * *